United States Patent
Lee et al.

(10) Patent No.: US 6,667,884 B1
(45) Date of Patent: Dec. 23, 2003

(54) HEAT DISSIPATING ASSEMBLY

(75) Inventors: Hsieh Kun Lee, Tu-chen (TW); DongYun Lee, Shenzhen (CN); Zhijie Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/373,915

(22) Filed: Feb. 24, 2003

(30) Foreign Application Priority Data

Sep. 9, 2002 (TW) .................................. 91214017 U

(51) Int. Cl.⁷ .................................................. H05K 7/20
(52) U.S. Cl. .................... 361/697; 24/458; 248/510; 165/80.3; 165/121; 165/185; 257/719; 361/707; 361/710; 361/719; 361/720; 361/704
(58) Field of Search .................. 24/457–458, 295–296; 248/505, 510; 165/80.2, 80.3, 121–126, 185; 257/718–719, 722, 726–727; 361/687, 694–697, 704, 707, 710, 719, 720

(56) References Cited

U.S. PATENT DOCUMENTS

| | | | | |
|---|---|---|---|---|
| 5,662,163 A | * | 9/1997 | Mira ......................... | 165/80.3 |
| 5,943,210 A | * | 8/1999 | Lee et al. .................... | 361/697 |
| 6,282,093 B1 | * | 8/2001 | Goodwin ..................... | 361/704 |
| 6,307,748 B1 | * | 10/2001 | Lin et al. .................... | 361/704 |
| 6,392,889 B1 | * | 5/2002 | Lee et al. .................... | 361/704 |
| 6,396,697 B1 | * | 5/2002 | Chen ........................ | 361/704 |
| 6,477,050 B1 | * | 11/2002 | Herring et al. ............. | 361/704 |
| 6,480,387 B1 | * | 11/2002 | Lee et al. ................... | 361/704 |
| 6,520,250 B2 | * | 2/2003 | Lee et al. ................... | 361/697 |
| 6,552,905 B2 | * | 4/2003 | Herring et al. ............. | 361/704 |

* cited by examiner

*Primary Examiner*—Gregory Thompson
(74) *Attorney, Agent, or Firm*—Wei Te Chung

(57) ABSTRACT

A heat dissipating assembly includes a CPU (35) mounted on a motherboard (30), a fan (20), two clips (60), a heat sink (10), two fasteners (50), a back plate (40) and two posts (70). The heat sink includes a base (12) and a plurality of fins (14). Two ears (16) are formed at respective opposite sides of the base. The clips mount the fan to the heat sink. The back plate is placed under the motherboard, and the posts are sequentially extended through the back plate, the motherboard and the ears of the heat sink. The fasteners are retained on the ears of the heat sink around the respective posts. The fasteners are rotated, causing the posts to resiliently press the fasteners on the ears, and resiliently press the back plate on the motherboard. Thus the heat sink is securely attached to the CPU on the motherboard.

23 Claims, 6 Drawing Sheets

HEAT DISSIPATING ASSEMBLY

BACKGROUND OF THE INVENTION

1. Field of the Invention

The present invention relates to a heat dissipating assembly for removing heat from an electronic package such as a central processing unit (CPU) that is mounted on a circuit board such as a motherboard, and particularly to a heat dissipating assembly which can be easily and securely assembled.

2. Description of the Related Art

With the continuing development of computer electronics technology, new electronic packages such as CPUs can perform more and more functions. Heat generated by these modern electronic packages has increased commensurately. Therefore, bigger and heavier heat sinks are becoming increasingly necessary to efficiently remove the heat from the electronic packages. Higher strength and tension is required for retaining these large heat sinks on the electronic packages.

A conventional kind of heat sink is found in Taiwan Patent No. 086212377 and in U.S. Pat. No. 5,464,054. In this kind of heat sink, a clip made from a single metal wire is positioned in a slot of a heat sink for mounting the heat sink to an electronic package. A plurality of barbs is formed in two sidewalls of the heat sink at the slot, for retaining the clip therein. Two resilient arms extend from opposite ends of the clip in directions substantially perpendicular to each other. A distal end of each arm is bent to form a hook engaging in a corresponding hole of a circuit board on which the electronic package is mounted, thereby fastening the heat sink to the electronic package.

However, the heat sink is prone to be displaced when the assembly is subjected to vibration or shock. Additionally, in assembly, an unduly large force is required to press the clip into the slot of the heat sink. Furthermore, a tool is required for installation or removal of the clip, which makes these processes excessively time consuming. Moreover, the tool is liable to slip during use, which can cause damage to other components on the circuit board. All these difficulties involving assembly retard efficiency in mass production facilities. Reduced efficiency is translated into increased costs.

Thus, a heat sink and fastening assembly which overcomes the above-mentioned problems is desired.

BRIEF SUMMARY OF THE INVENTION

Accordingly, an object of the present invention is to provide a heat dissipating assembly which can be easily and securely assembled.

To achieve the above object, a heat dissipating assembly in accordance with a preferred embodiment of the present invention comprises a CPU mounted on a motherboard, a fan, two clips, a heat sink, two fasteners, a back plate and two posts. The heat sink comprises a base and a plurality of fins. Two ears are formed at respective opposite sides of the base. A fastening hole is defined in each ear. Two slots are defined at two respective opposite sides of the plurality of fins. Each clip comprises a sidewall and a top wall. A retaining portion is formed at a bottom of the sidewall for engaging in a corresponding slot of the heat sink, and two pins depend from the top wall for engaging in corresponding holes of the fan. The clips thus mount the fan to the heat sink. The back plate is placed under the motherboard, and the posts are sequentially extended through the back plate, the motherboard and the fastening holes of the ears of the heat sink. The fasteners are retained on the ears of the heat sink around the respective posts. The fasteners are rotated, causing the posts to resiliently press the fasteners on the ears, and resiliently press the back plate on the motherboard. Thus the heat sink is securely attached to the CPU on the motherboard.

Other objects, advantages and novel features of the present invention will be drawn from the following detailed description of preferred embodiments of the present invention with the attached drawings, in which:

DETAILED DESCRIPTION OF THE INVENTION

Figure 1:
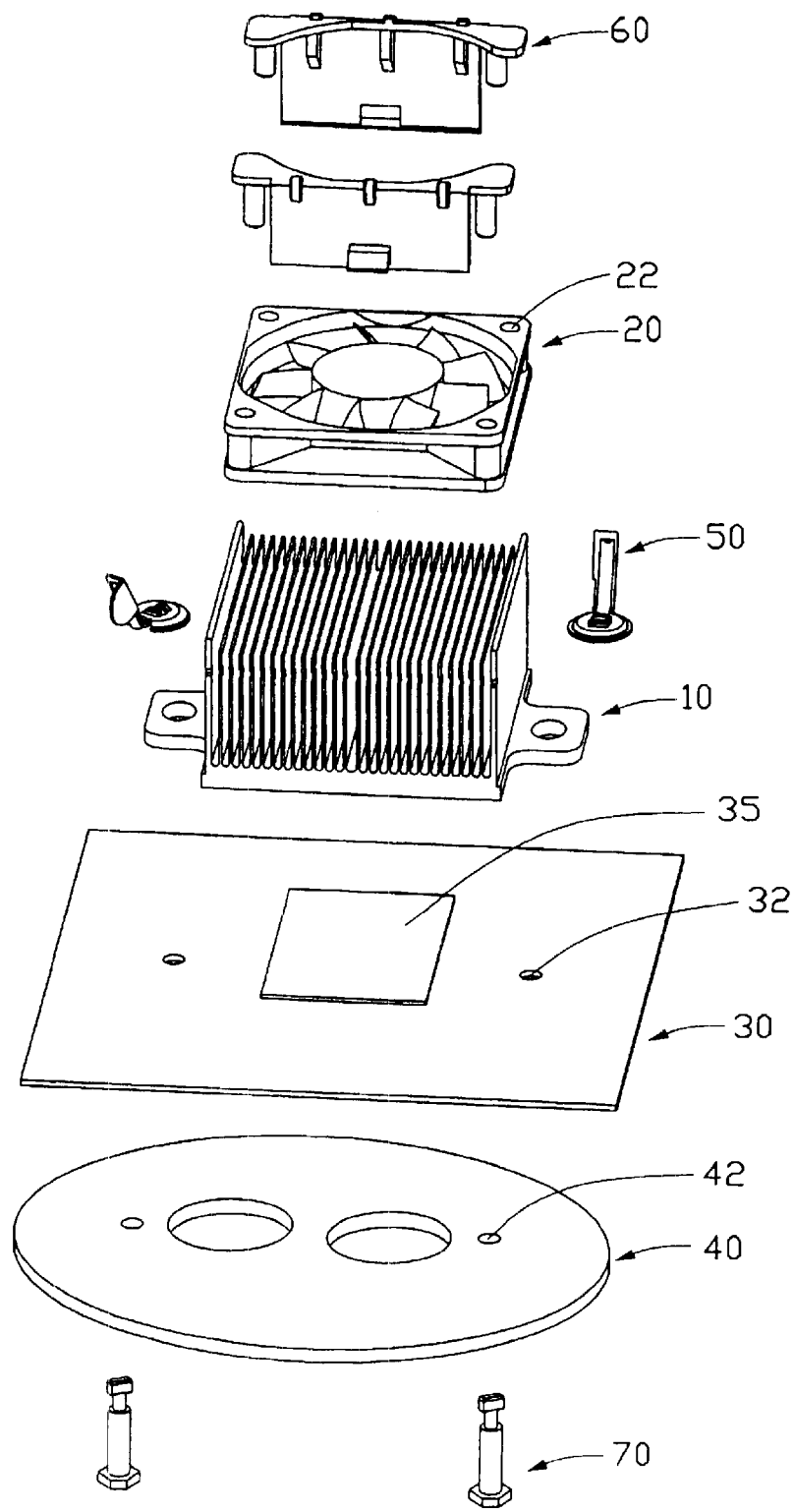
FIG. 1 is an exploded, isometric view of a heat dissipating assembly in accordance with a preferred embodiment of the present invention.

Referring to FIG. 1, a heat dissipating assembly in accordance with a preferred embodiment of the present invention comprises a CPU 35 mounted on a motherboard 30, a fan 20, two clips 60, a heat sink 10, two fasteners 50, a back plate 40, and two posts 70. Two spaced through holes 32 are defined in the motherboard 30, at opposite sides of the CPU 35 respectively. Four holes 22 are defined in four corners of the fan 20 respectively. Two through apertures 42 are defined in opposite sides of the back plate 40 respectively, for receiving the posts 70 therethrough.

Figure 2:
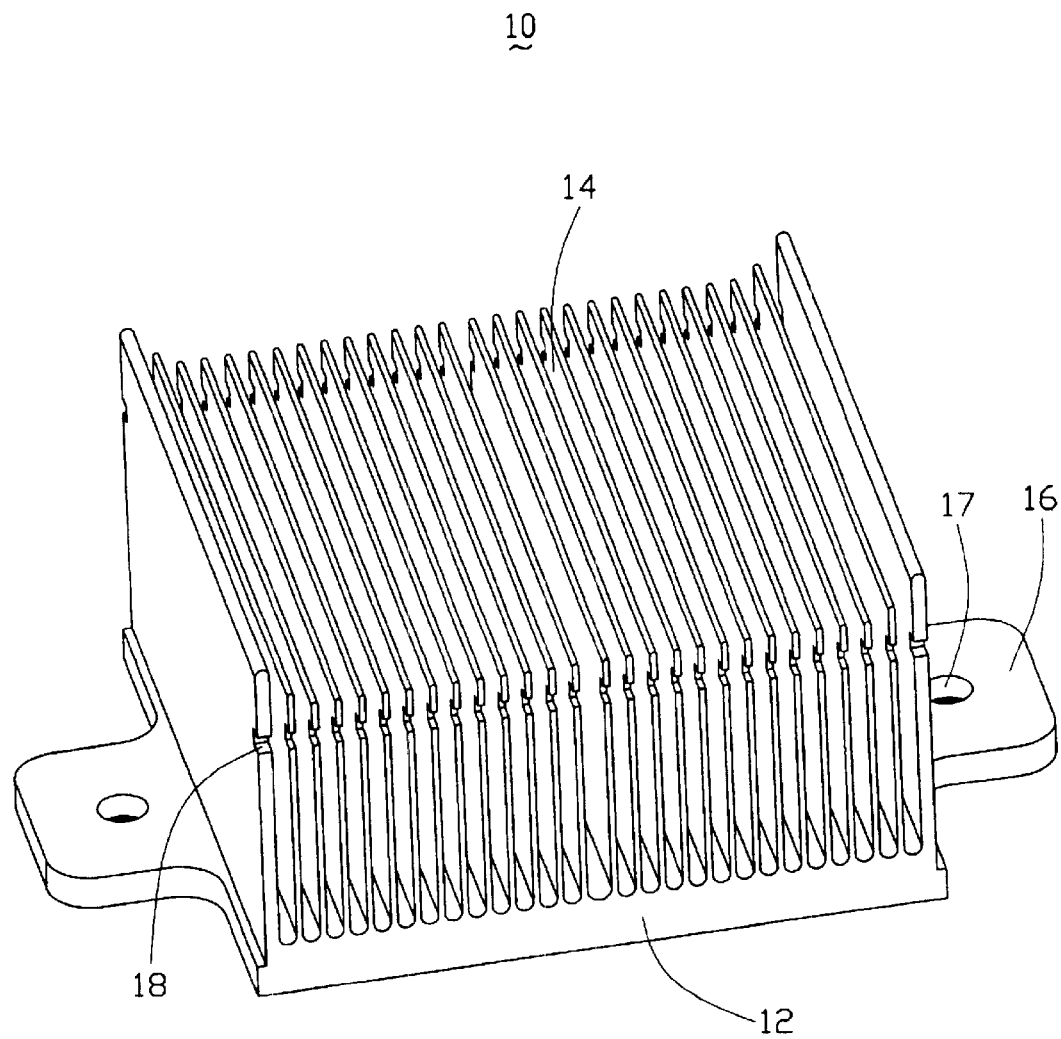
FIG. 2 is an enlarged, isometric view of a heat sink of the heat dissipating assembly of FIG. 1, viewed from another aspect.

Referring to FIG. 2, the heat sink 10 comprises a base 12, and a plurality of parallel fins 14 extending upwardly from the base 12. Two ears 16 extend coplanarly outwardly from opposite ends of the base 12 respectively. A fastening hole 17 is defined in each ear 16. Two slots 18 are transversely defined through the plurality of fins 14, at upper portions of respective opposite sides of the fins 14.

Figure 3:
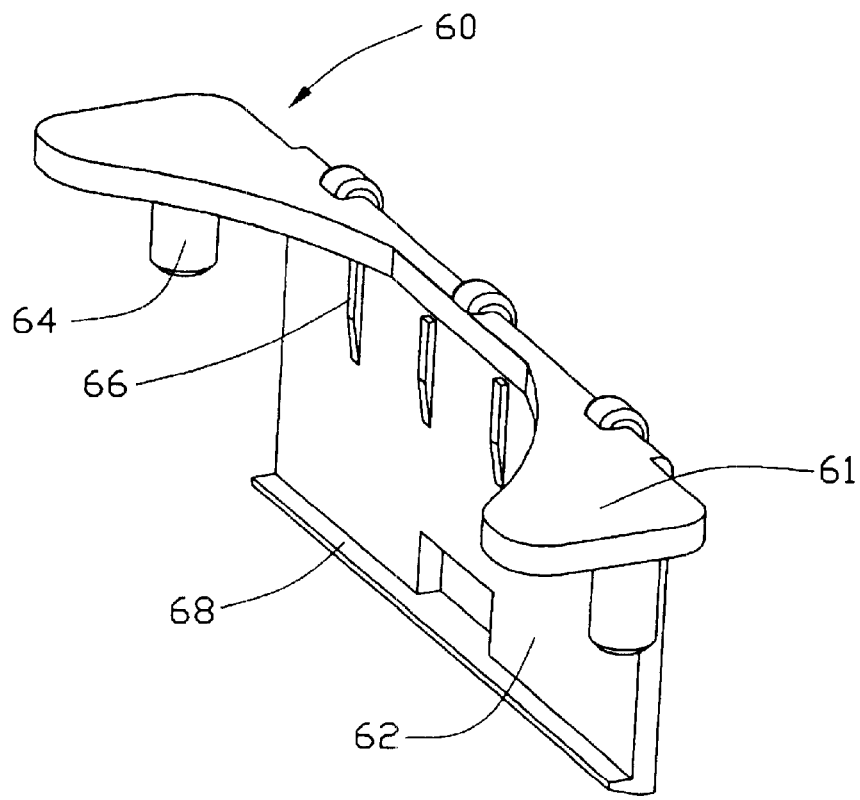
FIG. 3 is an enlarged, isometric view of a clip of the heat dissipating assembly of FIG. 1, viewed from another aspect.

Referring to FIG. 3, each clip 60 comprises a sidewall 62 and a top wall 61 perpendicularly extending the sidewall 62. A tab 63 (see FIG. 7) extends from a lower portion of a main face of the sidewall 62 that is distal from the top wall 61, for operating the clip by hand. Two pins 64 depend from opposite ends of the top wall 61 respectively. A plurality of reinforcing ribs 66 is formed on a main face of the sidewall 62 that is proximal to the top wall 61. A bottom edge of the sidewall 62 is perpendicularly bent to form a retaining portion 68 that is parallel to the top wall 61. The retaining portion 68 is for engaging in a corresponding slot 18 of the heat sink 10.

Figure 4:
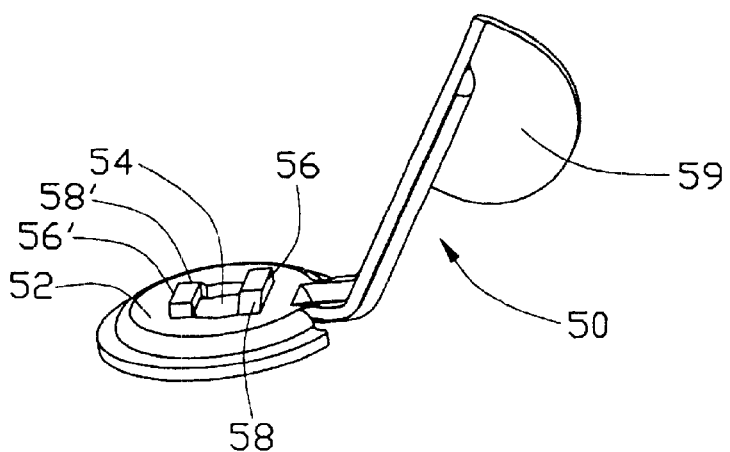
FIG. 4 is an enlarged, isometric view of a fastener of the heat dissipating assembly of FIG. 1, viewed from another aspect.

Referring to FIG. 4, each fastener 50 comprises a circular base plate 52 and a handle 59 extending inclinedly upwardly and outwardly from the circular base plate 52. A generally rectangular retaining opening 54 is defined in a central portion of the base plate 52. Two projecting blocks 56, 56' are formed on the base plate 52 at respective opposite long sides of the retaining, opening 54. A ramp 58 is defined on one end of the projecting block 56. A ramp 58' is defined on one end of the projecting block 56', such that the ramp 58' is generally diagonally opposite from the ramp 58. . A top face of each projecting block 56, 56' is planar.

Figure 5:
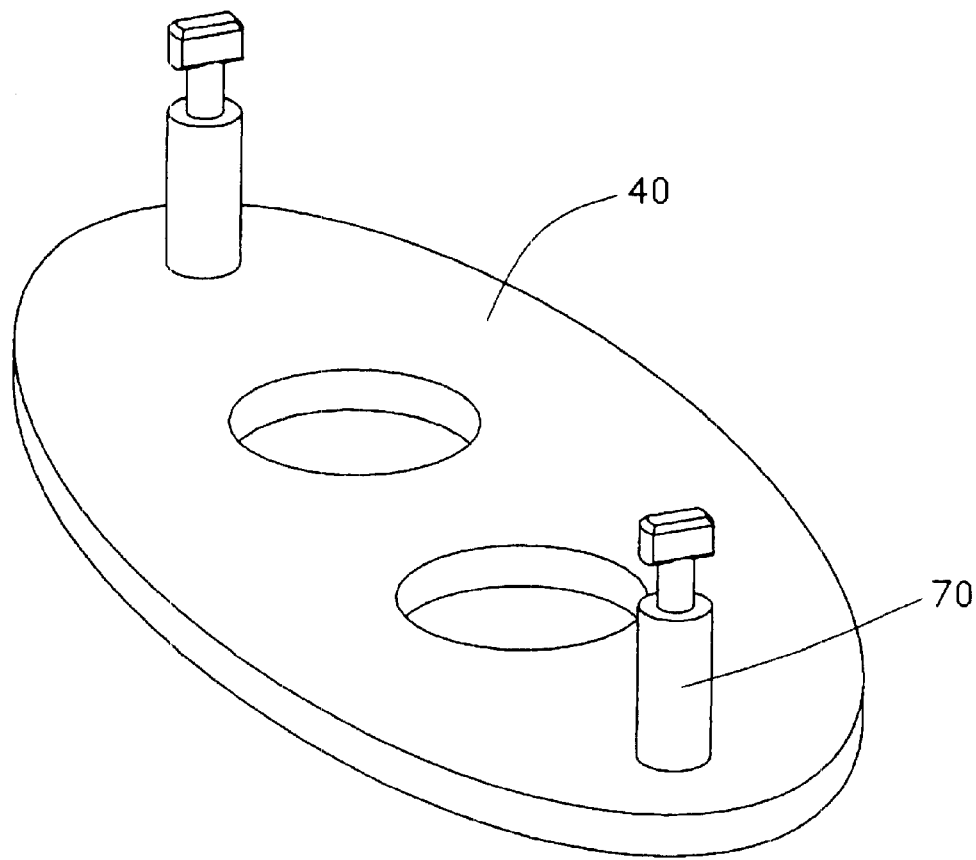
FIG. 5 is an enlarged, isometric view of a back plate and two posts of the heat dissipating assembly of FIG. 1, viewed from another aspect and showing the posts received in the back plate.
Figure 6:
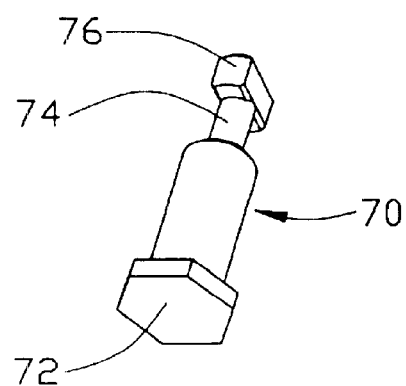
FIG. 6 is an enlarged, isometric view of one of the posts of FIG. 5, viewed from another aspect.

Referring to FIGS. 5 and 6, each post 70 comprises a stop 72 at a bottom thereof, and a head 76 at a top thereof. A narrowed neck 74 is defined below the head 76. A diameter of the post 70 is slightly less than a diameter of either of the through apertures 42 of the back plate 40. A diameter of the stop 72 is slightly greater than a diameter of either of the through apertures 42. The stops 72 of the posts 70 are stamped to the corresponding through apertures 42 of the back plate 40. So the posts 70 are fixedly attached to the back plate 40. In the preferred embodiment of the present invention, the back plate 40 is elliptical. In alternative embodiments of the present invention, the back plate 40 may have other shapes.

Figure 7:
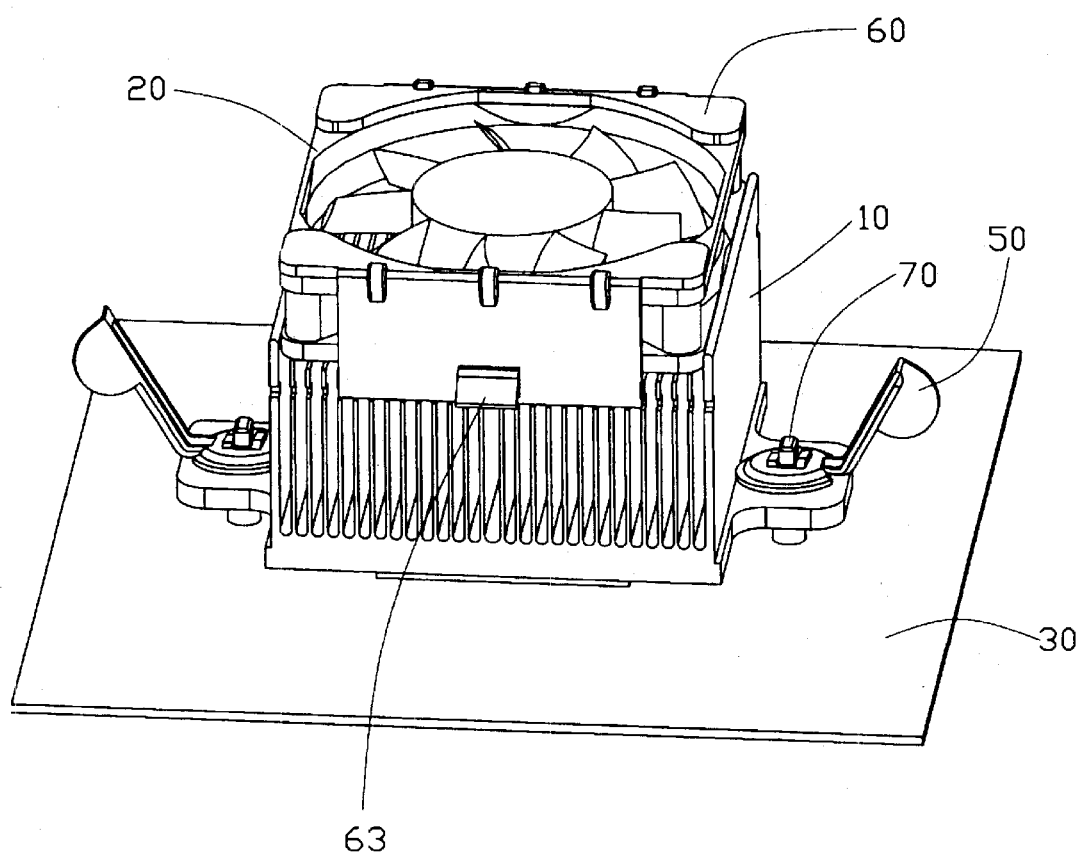
FIG. 7 is a partly assembled view of FIG. 1.

Referring to FIG. 7, in assembly, the fastening holes 17 of the heat sink 10, the through holes 32 of the motherboard 30 and the mounting holes 42 of the back plate 40 are respectively aligned with each other. The posts 70 are sequentially inserted through the mounting holes 42, the through holes 32 and the fastening holes 17. The fasteners 50 are attached on the corresponding posts 70, with the posts 70 extending through the corresponding retaining openings 54 of the fasteners 50. The heat sink 10 is thus loosely supported on the CPU 35 of the motherboard 30.

The clips 60 are placed on opposite sides of the fan 20. The pins 64 of the clips 60 are received in the holes 22 of the fan 20. The pins 64 and the ribs 66 of the clips 60 cooperatively clamp the fan 20. At the same time, the retaining portions 68 of the clips 60 are engaged in the corresponding slots 18 of the heat sink 10. Thus the fan 20 is mounted on the heat sink 10.

Figure 8:
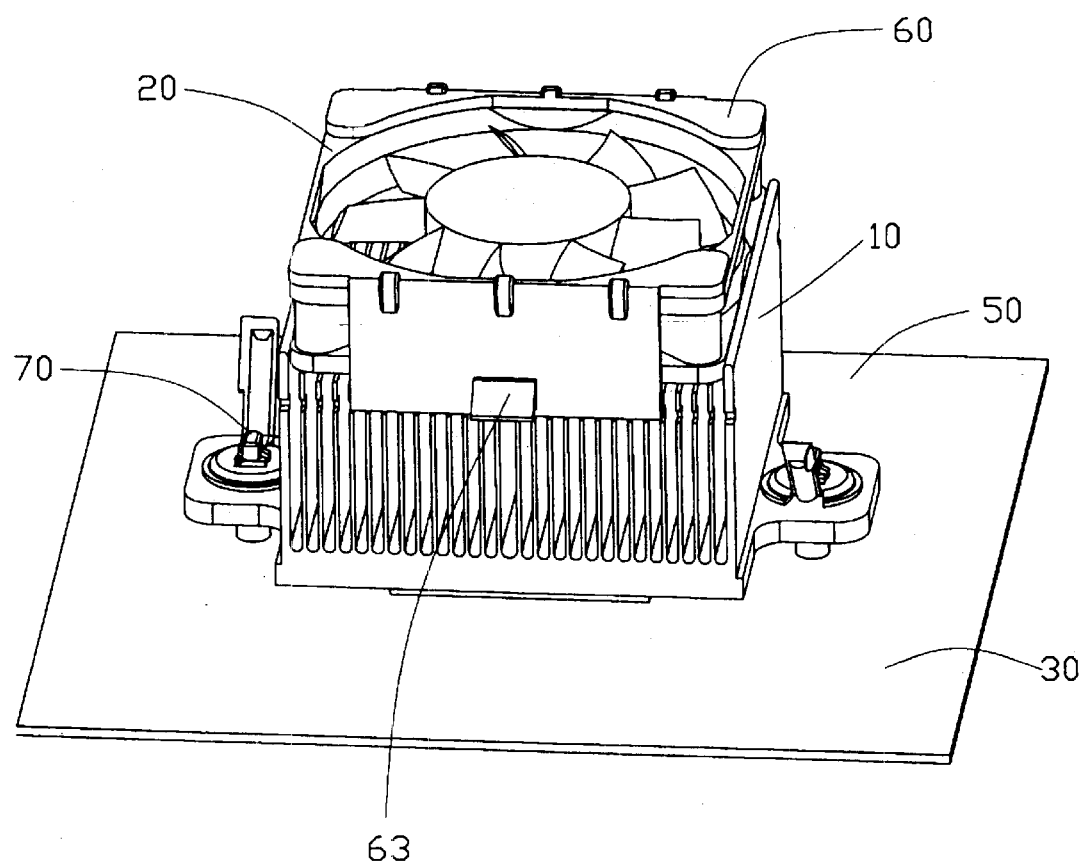
FIG. 8 is a fully assembled view of FIG. 1.

Referring to FIG. 8, the handle 59 of each fastener 50 is manipulated so that the fastener 50 rotates. The ramps 58, 58' of the fastener 50 rotatingly move under the head 76 of the corresponding post 70 until the head 76 is fully supported on respective main portions of the projecting blocks 56, 56'. The head 76 thus resiliently presses down on the projecting blocks 56, 56'; while at the other end of the post 70, the stop 72 presses up on the back plate 40. Accordingly, the ears 16 of the heat sink 10 are securely held by the fasteners 50, and the back plate 40 is securely held on the motherboard 30. The fan 20, the heat sink 10 and the motherboard 30 are attached together, with the heat sink 10 securely mounted on the CPU 35.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipating assembly comprising:
   a circuit board having two spaced through holes defined therein;
   an electronic package mounted on the circuit board between the through holes;
   a heat sink mounted on the electronic package, the heat sink having a base and a plurality of fins extending from the base, and two ears arranged at two opposite sides of the base respectively, two fastening holes being defined in the ears corresponding to the through holes of the circuit board, two slots being defined through the plurality of fins at two opposite sides of the fins;
   a fan defining four holes in four corners thereof;
   two clips securing the fan onto the heat sink, each of the clips comprising a sidewall and a top wall perpendicularly extending from the sidewall, a retaining portion being formed at a lower portion of the sidewall engaging in a corresponding slot of the heat sink, and two pins depending from the top wall being received in corresponding holes of the fan;
   a back plate mounted on an underside of the circuit board, two posts being sequentially inserted through the back plate, the holes of the circuit board and the fastening holes of the ears of the heat sink; and
   two fasteners cooperating with the back plate to resiliently hold the heat sink to the circuit board.

2. The heat dissipating assembly as claimed in claim 1, wherein each of the fasteners has a generally circular base plate, and a generally rectangular opening defined in a middle of the base plate.

3. The heat dissipating assembly as claimed in claim 2, wherein two projecting blocks are formed on the base plate at respective opposite long sides of the opening.

4. The heat dissipating assembly as claimed in claim 3, wherein two ramps are respectively defined at ends of the blocks that are diagonally opposite from each other.

5. The heat dissipating assembly as claimed in claim 2, wherein a handle extends inclinedly upwardly and outwardly from the base plate of each of the fasteners.

6. The heat dissipating assembly as claimed in claim 1, wherein each of the posts comprises a bottom stop, a head, and a neck below the head.

7. The heat dissipating assembly as claimed in claim 6, wherein the head is supported on the block of a corresponding fastener.

8. The heat dissipating assembly as claimed in claim 7, wherein each of the blocks has a top surface adapted to support the head of a corresponding fastener thereon.

9. The heat dissipating assembly as claimed in claim 1, wherein a tab extends from a main face of the sidewall of each of the clips.

10. A fastening assembly for mounting a heat sink to a circuit board, comprising:
    two fasteners adapted to be seated on opposite sides of the heat sink, each of the fasteners having a base plate, a handle, extending from the base plate, a rectangular opening defined in the base plate, and two projecting blocks provided on the base plate at respective opposite long sides of the opening; and
    two posts each having a stop located under the underside of the circuit board, each of the posts having a rectangular head for extension through the opening of a corresponding fastener, wherein
    when the fasteners are rotated, the heads of the posts are fully supported on the projecting blocks of the fasteners, whereby the fasteners press the heat sink to the circuit board.

11. The fastening assembly as claimed in claim 10, wherein each of the fasteners defines two ramps respectively on ends of the blocks that are diagonally opposite from each other, for guiding the head of a corresponding post during rotation of the fastener.

12. The fastening assembly as claimed in claim 10, wherein each of the blocks has a top surface adapted to support the head of a corresponding fastener thereon.

13. The fastening assembly as claimed in claim 10, wherein the handle extends inclinedly upwardly and outwardly from the base plate.

14. The fastening assembly as claimed in claim 10, wherein each of the posts comprises a bottom stop, a head, and a neck below the head.

15. The fastening assembly as claimed in claim 10, further comprising a back plate under the circuit board, wherein the posts are engaged with an underside of the back plate.

16. A heat dissipation assembly comprising:
   a heat sink including a base with a plurality of fins extending upwardly therefrom;
   a pair of first engaging devices formed on two opposite sides of said fins;
   a fan located on a top face commonly defined by said fins;
   a plurality of first engaging means defined on two opposite sides of the fan; and
   a pair of clips spaced from each other and located upon said two sides of the fan, wherein
      each of said clips includes a top wall downwardly abutting against a top face of the fan, a side wall located by the corresponding side of the fins with a second engaging device latchably engaged with the corresponding first engaging device, and at least one second engaging means extending from the top wall and retainably engaged with the corresponding first engaging means, so that said pair of clips cooperate with each other to commonly engage the fan and the fins for fastening the fan to the heat sink securely.

17. The assembly as claimed in claim 16, wherein said first engaging device is a slot, and said second engaging device is a projecting retaining portion.

18. The assembly as claimed in claim 17, wherein said slot extending transversely relative to said fins.

19. The assembly as claimed in claim 16, wherein said first engaging means is a hole, and said second engaging means is a post.

20. The assembly as claimed in claim 16, wherein the fins at two opposite ends extend upwardly beyond said top face to engage two other sides of the fan for restricting movement of the fan in a direction along a lengthwise direction of the clips.

21. The assembly as claimed in claim 16, wherein said fins are integrally formed with the base.

22. A heat sink assembly comprising:
   a printed circuit board defining at least one through hole;
   an electronic package assembly mounted on a top face of the printed circuit board;
   a heat sink seated upon said electronic package and defining an ear with therein a through aperture in vertical alignment with said through hole;
   a back plate disposed on an underside of the printed circuit board and including at least a post extending through both said through hole and said through aperture, said post defining a head at a top end; and
   a fastener located on the ear and defining a retaining opening through which the post extends; wherein
      the fastener is moveable relative to said post to be in either a first position where said fastener engages the head and exerts forces on the heat sink for urging the heat sink against the electronic package assembly, or a second position where said fastener is disengaged from the head and releases said heat sink.

23. The assembly as claimed in claim 22, wherein said fastener is coaxially rotatable relative to the post.

* * * * *